United States Patent
Cases et al.

(10) Patent No.: US 9,277,653 B2
(45) Date of Patent: Mar. 1, 2016

(54) THROUGH-HOLE-VIAS IN MULTI-LAYER PRINTED CIRCUIT BOARDS

(71) Applicant: LENOVO ENTERPRISE SOLUTIONS (SINGAPORE) PTE. LTD., Singapore (SG)

(72) Inventors: Moises Cases, Austin, TX (US); Tae Hong Kim, Round Rock, TX (US); Rohan U. Mandrekar, Austin, TX (US); Nusrat I. Sherali, Austin, TX (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 97 days.

(21) Appl. No.: 14/152,096

(22) Filed: Jan. 10, 2014

(65) Prior Publication Data

US 2014/0123489 A1 May 8, 2014

Related U.S. Application Data

(62) Division of application No. 12/570,029, filed on Sep. 30, 2009, now Pat. No. 8,242,384, and a division of application No. 13/448,787, filed on Apr. 17, 2012, now Pat. No. 8,658,911.

(51) Int. Cl.
*H05K 1/03* (2006.01)
*H05K 3/00* (2006.01)
(Continued)

(52) U.S. Cl.
CPC ............ *H05K 3/0094* (2013.01); *H05K 1/0242* (2013.01); *H05K 1/0251* (2013.01);
(Continued)

(58) Field of Classification Search
CPC ............. H05K 1/03; H05K 1/11; H05K 3/00; H05K 3/10; H05K 3/24; H05K 3/32; H05K 3/36; H05K 3/40; H05K 3/42; H01C 7/02; H01L 21/02; H01L 21/44; H01L 29/12; H01L 29/40

USPC ................ 174/266, 255, 257, 260, 262, 263; 257/621, 774; 428/620; 438/117, 612, 438/677; 228/115; 29/830, 846, 852
See application file for complete search history.

(56) References Cited

U.S. PATENT DOCUMENTS 2,872,391 A * 2/1959 Hauser et al. ................ 205/125
2,897,409 A * 7/1959 Gitto ............................. 174/257
(Continued)

FOREIGN PATENT DOCUMENTS

EP      0213205 A1   3/1987
EP    1 202 296 A1   5/2002
(Continued)

OTHER PUBLICATIONS

Anonymous, "Method for a Cylindrical Chip Capacitor", IP.com Prior Art Database Technical Disclosure (online publication), Mar. 16, 2005, 10 pages, IP.com, USA, IP.com No. IPCOM000101630D.

*Primary Examiner* — Xiaoliang Chen
(74) *Attorney, Agent, or Firm* — Edward J. Lenart; Katherine S. Brown; Kennedy Lenart Spraggins LLP (57) ABSTRACT

Example multi-layer printed circuit boards ('PCBs') are described as well as methods of manufacturing a PCB. Embodiments include depositing upon layers of laminate printed circuit traces and joining the layers of laminate. Embodiments also include drilling at least one via hole through the layers of laminate and placing in the via hole a via conductor comprising a used portion and an unused portion, the via conductor comprising copper coated with a second metal having a conductivity lower than the conductivity of copper.

5 Claims, 6 Drawing Sheets

(51) Int. Cl.
  *H05K 3/42*   (2006.01)
  *H05K 1/02*   (2006.01)
  *H05K 1/09*   (2006.01)
  *H05K 1/16*   (2006.01)
  *H05K 3/24*   (2006.01)

(52) U.S. Cl.
  CPC .............. *H05K3/0047* (2013.01); *H05K 3/429* (2013.01); *H05K 1/0234* (2013.01); *H05K 1/09* (2013.01); *H05K 1/167* (2013.01); *H05K 3/244* (2013.01); *H05K 2201/0391* (2013.01); *Y10T 29/4913* (2015.01); *Y10T 29/49126* (2015.01); *Y10T 29/49155* (2015.01); *Y10T 29/49165* (2015.01); *Y10T 156/1057* (2015.01); *Y10T 428/12528* (2015.01)

(56) References Cited

U.S. PATENT DOCUMENTS

| | | | |
|---|---|---|---|
| 4,131,516 A * | 12/1978 | Bakos et al. | 29/832 |
| 4,733,461 A | 3/1988 | Nakano | |
| 5,298,686 A | 3/1994 | Bourdelaise et al. | |
| H1471 H * | 8/1995 | Braun et al. | 361/704 |
| 5,452,178 A | 9/1995 | Emesh et al. | |
| 5,715,144 A * | 2/1998 | Ameen et al. | 361/790 |
| 5,744,759 A * | 4/1998 | Ameen et al. | 174/260 |
| 5,907,903 A * | 6/1999 | Ameen et al. | 29/830 |
| 5,963,464 A | 10/1999 | Dell et al. | |
| 5,967,799 A | 10/1999 | Arai | |
| 5,998,259 A | 12/1999 | Chuang | |
| 6,070,785 A * | 6/2000 | Ameen et al. | 228/115 |
| 6,076,726 A * | 6/2000 | Hoffmeyer et al. | 228/180.22 |
| 6,124,781 A * | 9/2000 | Hogge et al. | 338/22 R |
| 6,172,591 B1 * | 1/2001 | Barrett | 338/22 R |
| 6,194,774 B1 | 2/2001 | Cheon | |
| 6,197,181 B1 | 3/2001 | Chen | |
| 6,236,302 B1 * | 5/2001 | Barrett et al. | 338/22 R |
| 6,290,833 B1 | 9/2001 | Chen | |
| 6,300,578 B1 * | 10/2001 | Hoffmeyer et al. | 174/263 |
| 6,404,001 B2 | 6/2002 | Koo et al. | |
| 6,512,285 B1 | 1/2003 | Hashemi et al. | |
| 6,541,712 B1 | 4/2003 | Gately et al. | |
| 6,621,012 B2 | 9/2003 | Crockett et al. | |
| 6,638,410 B2 | 10/2003 | Chen et al. | |
| 6,646,520 B2 | 11/2003 | Miller | |
| 6,653,170 B1 * | 11/2003 | Lin | 438/117 |
| 6,678,145 B2 | 1/2004 | Naito et al. | |
| 6,680,659 B2 | 1/2004 | Miller | |
| 6,775,901 B1 | 8/2004 | Lee et al. | |
| 6,803,665 B1 | 10/2004 | Megahed et al. | |
| 6,822,529 B2 | 11/2004 | Miller | |
| 6,853,003 B2 | 2/2005 | Lee | |
| 6,913,471 B2 | 7/2005 | Smith | |
| 6,927,481 B2 | 8/2005 | Gibson et al. | |
| 6,958,547 B2 | 10/2005 | Dubin et al. | |
| 6,983,535 B2 | 1/2006 | Crockett et al. | |
| 7,005,721 B2 | 2/2006 | Nishijima | |
| 7,030,712 B2 | 4/2006 | Brunette et al. | |
| 7,118,985 B2 | 10/2006 | Allman et al. | |
| 7,154,356 B2 | 12/2006 | Brunette et al. | |
| 7,186,919 B2 | 3/2007 | Kim et al. | |
| 7,204,648 B2 | 4/2007 | Aronson | |
| 7,227,240 B2 | 6/2007 | Knapp et al. | |
| 7,249,337 B2 | 7/2007 | Gisin et al. | |
| 7,277,005 B2 | 10/2007 | Kang et al. | |
| 7,342,300 B2 | 3/2008 | Wight et al. | |
| 2002/0191366 A1 | 12/2002 | Naito et al. | |
| 2002/0195271 A1 | 12/2002 | Gailus | |
| 2003/0188886 A1 * | 10/2003 | Fey et al. | 174/256 |
| 2005/0029014 A1 * | 2/2005 | Miura | 174/262 |
| 2005/0062556 A1 | 3/2005 | Aronson | |
| 2005/0178669 A1 | 8/2005 | Strubbe | |
| 2005/0184825 A1 | 8/2005 | Oran | |
| 2005/0233501 A1 | 10/2005 | Nose et al. | |
| 2005/0251997 A1 * | 11/2005 | Homg et al. | 29/830 |
| 2006/0046088 A1 * | 3/2006 | Akram et al. | 428/620 |
| 2006/0254052 A1 * | 11/2006 | Miura | 29/846 |
| 2007/0004200 A1 * | 1/2007 | Akram et al. | 438/677 |
| 2007/0045779 A1 * | 3/2007 | Hiatt | 257/621 |
| 2007/0045780 A1 * | 3/2007 | Akram et al. | 257/621 |
| 2007/0103251 A1 | 5/2007 | Fan et al. | |
| 2007/0117348 A1 | 5/2007 | Ramanathan et al. | |
| 2007/0132105 A1 * | 6/2007 | Akram et al. | 257/774 |
| 2007/0257373 A1 * | 11/2007 | Akram et al. | 257/774 |
| 2008/0054428 A1 | 3/2008 | Lam | |
| 2008/0277146 A1 * | 11/2008 | Hwang et al. | 174/255 |
| 2009/0049414 A1 | 2/2009 | Mutnury et al. | |
| 2009/0176362 A1 * | 7/2009 | Akram et al. | 438/612 |
| 2009/0223710 A1 * | 9/2009 | Becker et al. | 174/264 |
| 2010/0124035 A1 | 5/2010 | Bandholz et al. | |
| 2011/0073359 A1 | 3/2011 | Cases et al. | |
| 2011/0108972 A1 | 5/2011 | Foster, Sr. et al. | |
| 2011/0109381 A1 | 5/2011 | Foster, Sr. et al. | |
| 2011/0110064 A1 | 5/2011 | Foster, Sr. et al. | |
| 2011/0110065 A1 | 5/2011 | Foster, Sr. et al. | |
| 2011/0148543 A1 | 6/2011 | Bandholz et al. | |
| 2012/0193135 A1 | 8/2012 | Cases et al. | |
| 2012/0200346 A1 | 8/2012 | Cases et al. | |
| 2012/0218024 A1 | 8/2012 | Foster, Sr. et al. | |
| 2012/0286431 A1 | 11/2012 | Foster, Sr. et al. | |
| 2012/0299640 A1 | 11/2012 | Foster, Sr. et al. | |
| 2013/0214855 A1 | 8/2013 | Foster, Sr. et al. | |

FOREIGN PATENT DOCUMENTS

| | | | |
|---|---|---|---|
| JP | 6140451 A | 5/1994 | |
| JP | 2000031651 A | 1/2000 | |
| WO | WO 2004/025695 A2 | 3/2004 | |

* cited by examiner

THROUGH-HOLE-VIAS IN MULTI-LAYER PRINTED CIRCUIT BOARDS

CROSS-REFERENCE TO RELATED APPLICATION

The present application is a divisional application and claims priority from U.S. patent application Ser. No. 12/570,029, filed on Sep. 30, 2009 and U.S. patent application Ser. No. 13/448,787, filed on Apr. 17, 2012.

BACKGROUND OF THE INVENTION

1. Field of the Invention

The field of the invention is data processing, or, more specifically, methods, apparatus, and products for multi-layer printed circuit boards with through-hole vias.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

One of the areas that has seen considerable development is PCB design, particularly as PCB bandwidths have advanced well into the gigahertz region. As electronic bandwidths expand, the impedances inherent in the conductive pathways on the PCBs themselves become relevant. When signal conductors change layers in multi-layer stackup applications, vias are used. However, when through-hole-vias are used for signal conductors to change layers, any unused via stub will hurt signal integrity. As frequency increases, signal performance is greatly impacted by reflections from those open stubs. A quarter-wave length resonance is particularly detrimental in high speed data transmissions. In current industry practice, termination methods using a resistor, an inductor or a capacitor are used to minimize those through-hole-via stub effects. However, the resistor termination results in undesired DC loss for the signal. The inductor/capacitor termination will shift the quarter-wave length resonance, but still have a resonance which can affect other frequency bands. Using those extra components requires real estate to mount those components which will eventually restrict the freedom of routability.

SUMMARY OF THE INVENTION

Example multi-layer printed circuit boards ('PCBs') are described as well as methods of manufacturing a PCB. Embodiments include depositing upon layers of laminate printed circuit traces and joining the layers of laminate. Embodiments also include drilling at least one via hole through the layers of laminate and placing in the via hole a via conductor comprising a used portion and an unused portion, the via conductor comprising copper coated with a second metal having a conductivity lower than the conductivity of copper.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
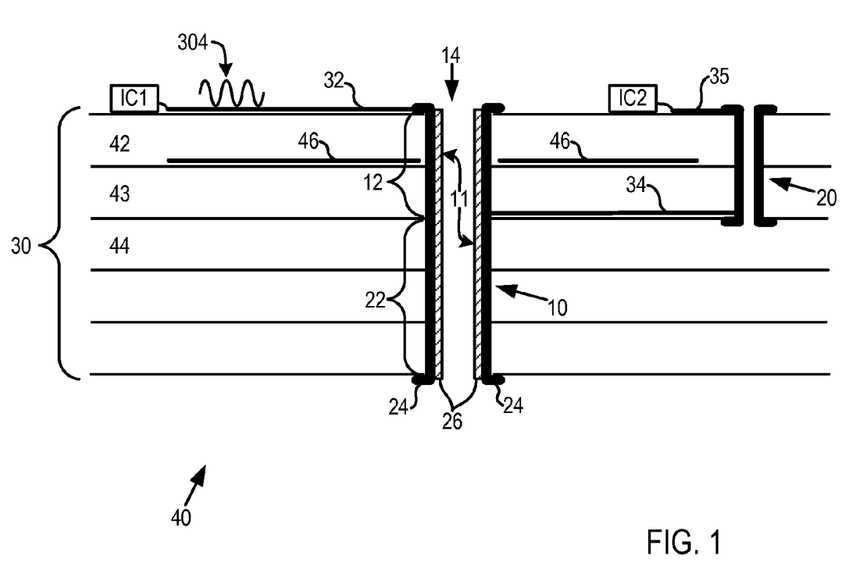
FIG. 1 sets forth a cross-sectional plan view of an example multi-layer PCB according to embodiments of the present invention.

Example multi-layer printed circuit boards ('PCBs') as well as methods of making and using such PCBs in accordance with embodiments of the present invention are described with reference to the accompanying drawings, beginning with FIG. 1. FIG. 1 sets forth a cross-sectional plan view of an example multi-layer PCB (40) according to embodiments of the present invention that includes layers of laminate (30), a via hole (14) traversing the layers of laminate, and a via conductor (24, 26) contained within the via hole. The via conductor includes a used portion (12) and an unused portion (22). The via conductor is composed of copper (24) coated with a metal (26) having a conductivity lower than the conductivity of copper.

In the example of FIG. 1, the used portion (12) of the via conductor (24, 26) conducts an alternating current signal (304) from a trace (32) on one layer (42) of the PCB (40) to a trace (34) on another layer (44) of the PCB. In addition, the alternating current signal (304) is characterized by a frequency high enough to demonstrate skin effect, moving the alternating current toward the surface (11) of the via conductor (24, 26), that is, in this example, toward the surface of the coating metal having a conductivity lower than the conductivity of copper.

Also in the example of FIG. 1, the unused portion (22) of the via conductor has no connection to any further trace, and the unused portion of the via conductor therefore implements a resonant stub that causes an insertion loss of the alternating current signal centered on a resonant frequency. Such a resonant stub can be modeled as a series resistance, inductance, and capacitance having a particular resonant frequency depending on the values of inductance and capacitance involved. The metal having a conductivity lower than the conductivity of copper increases resistive dampening of such a resonance and reduces the insertion loss of the alternating current signal as the signal traverses the used portion (12) of the via conductor between trace (32) and trace (34). The increased resistive dampening occurs because of the so-called "skin effect," which at higher frequencies, demonstrably moves alternating electric current flows towards the surface of conductors. Hence if the resonant stub, the unused portion (22) of the via conductor in such an example is coated with a material that has higher resistance than copper (like nickel or iron), the high frequency current will actually flow through a higher resistance path. This will provide additional damping in the resonant region thereby reducing the stub impact on the desired signal. Examples of such metals having lower conductivity or higher resistivity than copper include the mentioned iron and nickel, alloys of iron and nickel, compounds of iron and nickel, as well as aluminum, tin, zinc, many of their alloys, and other metals as will occur to those of skill in the art.

Figure 2:
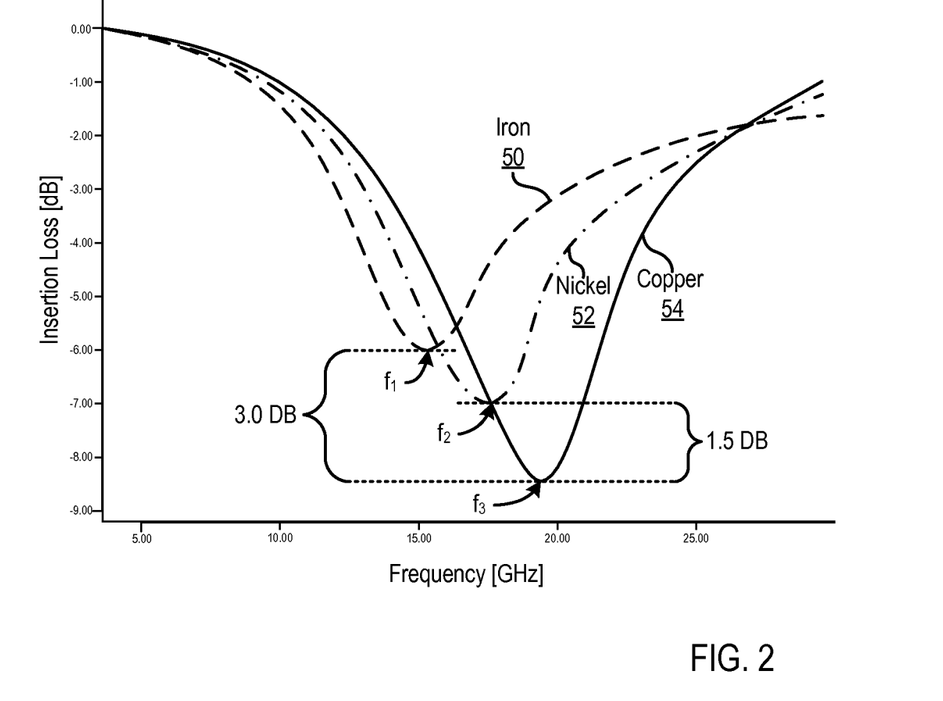
FIG. 2 sets forth an example graph of insertion loss for a via in a PCB according to embodiments of the present invention.

For further explanation, FIG. 2 sets forth an example graph of insertion loss for a via in a PCB according to embodiments of the present invention modeled with a via conductor of copper only (54), copper with a coating of nickel (52), and copper with a coating of iron (50). For ease of explanation, the example of FIG. 2 is discussed here with reference both to FIGS. 1 and 2. The example graph of FIG. 2 illustrates insertion loss for an example via according to embodiments of the present invention, similar to the one described and illustrated above with reference to FIG. 1, of 3 millimeters height and 100 micrometer radius modeled with a three-dimensional, full wave solver. The via was modeled with a signal path (32, 12, 34) from the top layer (42) of a PCB to the third layer (44), with a ground plane (46) disposed upon the second layer (43).

The graph of FIG. 2 shows the beneficial effect of increased resistive dampening of resonance with reduced insertion loss of the alternating current signal as the signal traverses the used portion (12) of the via conductor between trace (32) and trace (34). The copper-only graph (54) in FIG. 2 shows an insertion loss of about 8.5 dB centered on the resonant frequency $f_3$ of about 19 GHz. By comparison with copper only, the graph for insertion loss with copper coated with nickel (52) shows insertion loss reduced by 1.5 dB with center resonant frequency $f_2$ shifted down to about 18 GHz. The graph for with copper coated with iron (50) shows an even better insertion loss reduction of 3.0 dB with the center resonant frequency $f_1$ shifted even further down to about 15 GHz.

Figure 3:
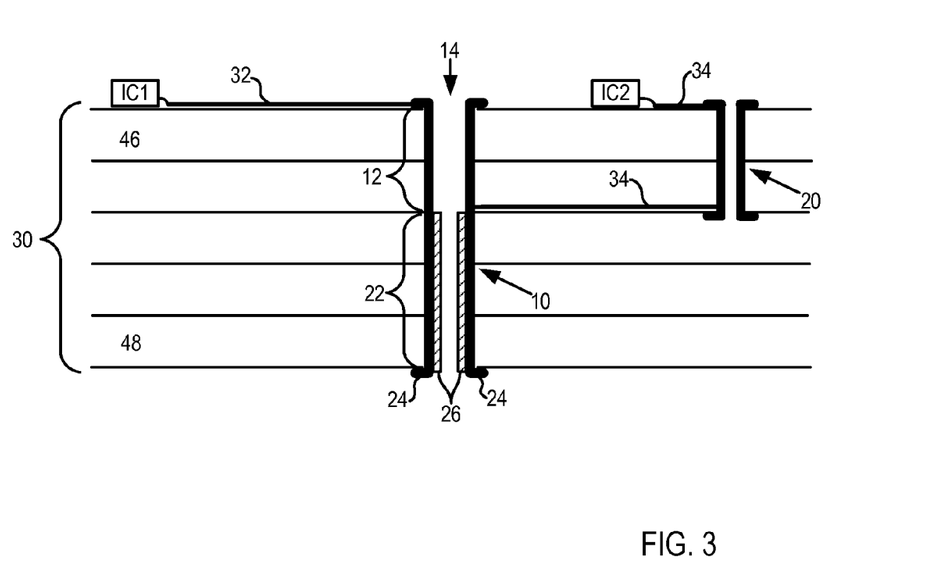
FIGS. 3 and 4 each sets forth a cross-sectional plan view of an additional example multi-layer PCB with a via according to embodiments of the present invention.
Figure 4:
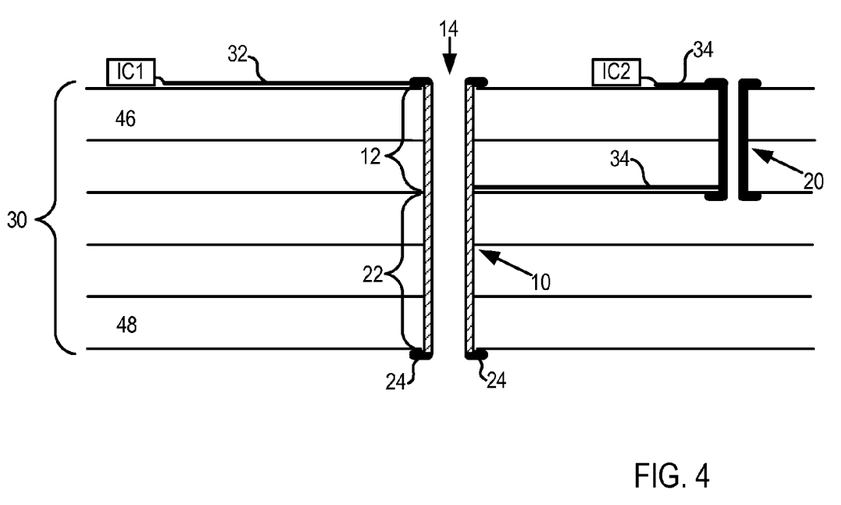

For further explanation, FIGS. 3 and 4 each sets forth a cross-sectional plan view of an additional example multi-layer PCB (40) with a via (10) according to embodiments of the present invention. Each such PCB (40) includes layers of laminate (30), a via hole (14) traversing the layers of laminate, and a via conductor (24, 26) contained within the via hole. Each via conductor include a used portion (12) and an unused portion (22). Each via conductor is composed of copper (24) coated with a metal (26) having a conductivity lower than the conductivity of copper. In the example of FIG. 3, both the used portion (12) and the unused portion (22) of the via conductor are composed of copper (24), and only the unused portion (22) of the via conductor is coated with a metal (26) having a conductivity lower than the conductivity of copper. In the example PCB (40) of FIG. 4, however, the entire via conductor (24) consists only of a metal having a conductivity lower than the conductivity of copper.

Figure 5:
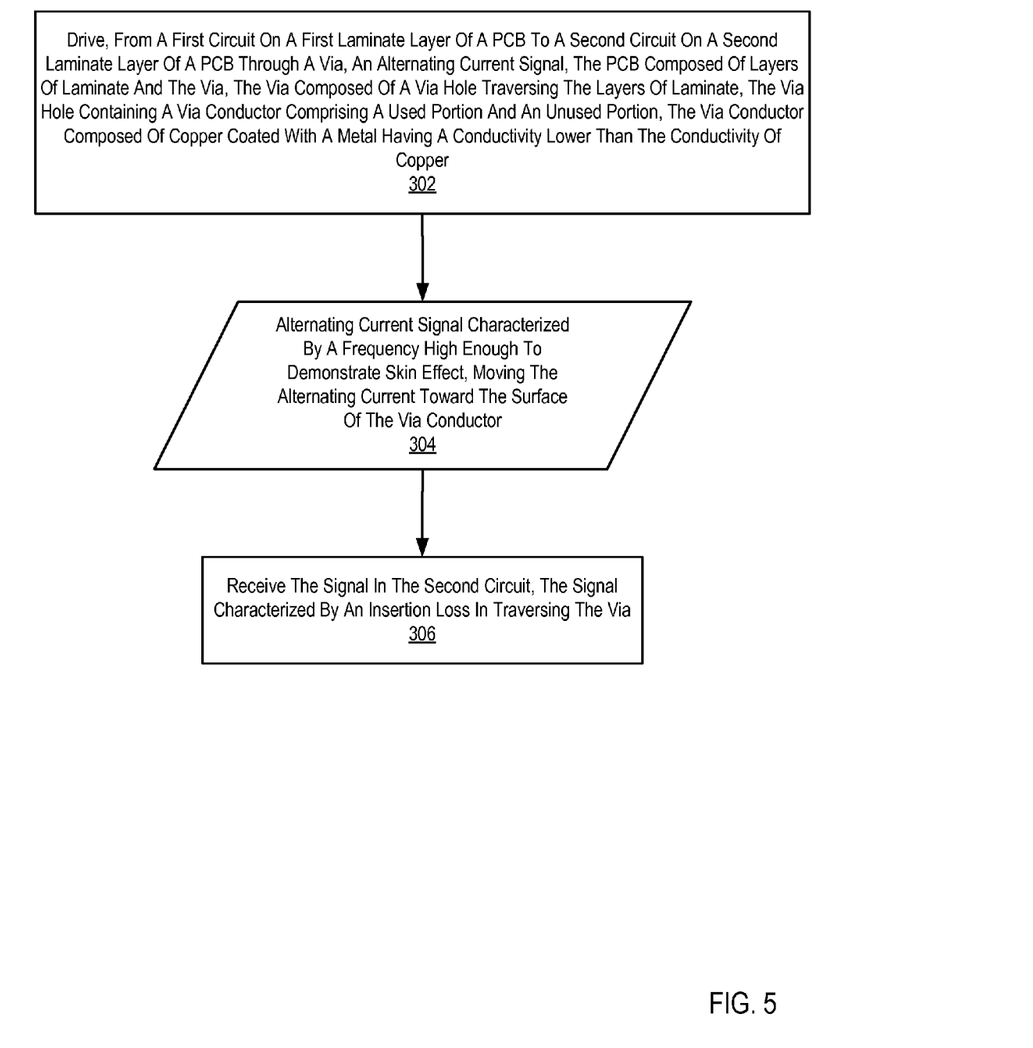
FIG. 5 sets forth a flow chart illustrating an example method of use of a multi-layer PCB according to embodiments of the present invention.

For further explanation, FIG. 5 sets forth a flow chart illustrating an example method of use of a multi-layer PCB according to embodiments of the present invention. The method of FIG. 5 is carried out with a PCB similar to the one described above with reference to FIG. 1, a multi-layer PCB (40) that includes layers of laminate (30) and a via (10) that is composed of a via hole (14) traversing the layers of laminate, and a via conductor (24, 26) contained within the via hole. The via conductor includes a used portion (12) and an unused portion (22). The via conductor is composed of copper (24) coated with a metal (26) having a conductivity lower than the conductivity of copper. The method of FIG. 5 therefore is described with reference to both FIGS. 1 and 5.

The method of FIG. 5 includes driving (302), from a first circuit (IC1) on a first laminate layer (42) of the PCB (40) to a second circuit (IC2) on a second laminate layer (44) of the PCB through a via (10), an alternating current signal (304). In this example, the first circuit is represented by integrated circuit IC1, and the second circuit is represented by integrated circuit IC2. The conductive pathway between IC1 and IC2 is composed of trace (32), the used portion (12) of the via conductor, trace (34), via (20), and trace (34).

The method of FIG. 5 also includes receiving (306) the signal (304) in the second circuit (IC2), where the signal is characterized by an insertion loss in traversing the via (10). In the method of FIG. 5, the alternating current signal (304) is characterized by a frequency high enough to demonstrate skin effect, moving the alternating current toward the surface of the via conductor as the alternating current signal traverses the via (10). The unused portion (22) of the via conductor has no connection to any further trace, and the unused portion (22) of the via conductor implements a resonant stub effecting an insertion loss of the alternating current signal centered on a resonant frequency. The metal having a conductivity lower than the conductivity of copper increases resistive dampening of resonance and reduces the insertion loss. Insertion loss in the via (20) connecting trace (34) to trace (35) in this example is of little concern, because there is no unused part, and therefore no resonant stub, in via (20).

In addition to the use of the PCB and via structure shown in FIG. 1, some embodiments implement the method of FIG. 5 on vias of the kind shown in FIG. 3 in which both the used portion (12) and the unused portion (22) of the via conductor comprise copper, and only the unused portion (22) of the via conductor is coated with a metal (26) having a conductivity lower than the conductivity of copper. In addition, some embodiments implement the method of FIG. 5 on vias of the kind shown in FIG. 5 where the entire via conductor (24) consists only of a metal having a conductivity lower than the conductivity of copper.

Figure 6:
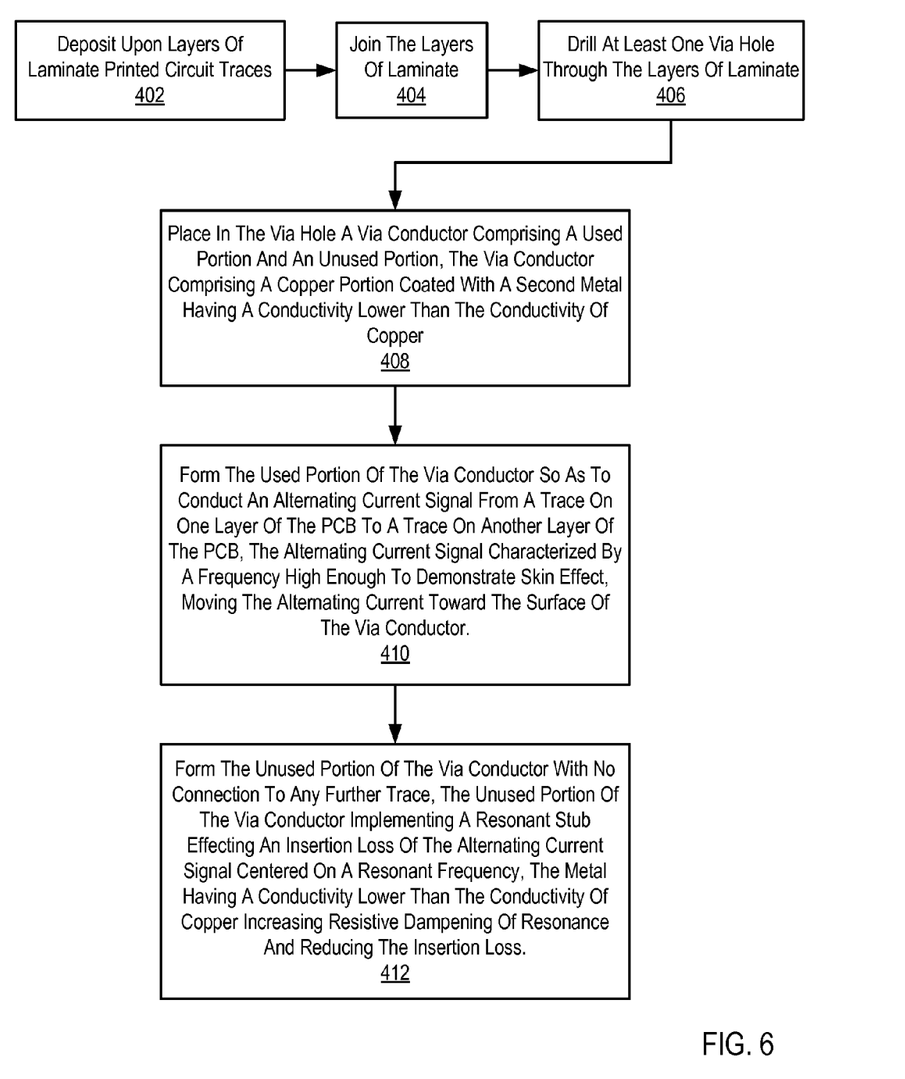
FIG. 6 sets forth a flow chart illustrating an example method of manufacturing a multi-layer PCB according to embodiments of the present invention.

For further explanation, FIG. 6 sets forth a flow chart illustrating an example method of manufacturing a multi-layer PCB according to embodiments of the present invention. Because the method of FIG. 6 produces a PCB similar to the one depicted above in FIG. 1, the method of FIG. 6 is described with reference to both FIGS. 1 and 6. The method of FIG. 6 includes depositing (402) upon layers of laminate (30) printed circuit traces (32, 34, 35), joining (404) the layers of laminate, and drilling (406) at least one via hole (14) through the layers of laminate. The method of FIG. 6 also includes placing (408) in the via hole (14) a via conductor (24, 26) composed of a used portion (12) and an unused portion (22). The via conductor is composed of copper (24) coated with a second metal (26) having a conductivity lower than the conductivity of copper.

The method of FIG. 6 also includes forming (410) the used portion (12) of the via conductor so as to conduct an alternating current signal (304) from a trace (32) on one layer of the PCB to a trace (34) on another layer of the PCB, where the alternating current signal characterized by a frequency high enough to demonstrate skin effect, moving the alternating current toward the surface of the via conductor.

The method of FIG. 6 also includes forming (412) the unused portion of the via conductor with no connection to any further trace, so that the unused portion of the via conductor implements a resonant stub effecting an insertion loss of the alternating current signal centered on a resonant frequency, with the metal having a conductivity lower than the conductivity of copper increasing resistive dampening of resonance and reducing the insertion loss. Alternatively in the method of FIG. 6, both the used portion (12) and the unused portion (22) of the via conductor may be copper, with only the unused portion (22) of the via conductor coated with a metal (26) having a conductivity lower than the conductivity of copper—as shown and described above with reference to FIG. 3. As a further alternative in the method of FIG. 6, the entire via conductor (24) may be formed only of a metal having a conductivity lower than the conductivity of copper—as shown and described above with reference to FIG. 4.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of manufacturing a multi-layer printed circuit board (PCB) comprising:
    depositing upon layers of laminate printed circuit traces;
    joining the layers of laminate;
    drilling at least one via hole through the layers of laminate;
    placing in the via hole a via conductor comprising a used portion and an unused portion, the via conductor comprising copper coated with a second metal having a conductivity lower than the conductivity of copper;
    wherein both the used portion and the unused portion of the via conductor comprise copper, and
    only the unused portion of the via conductor is coated with a metal having a conductivity lower than the conductivity of copper.

2. The method of claim 1 further comprising:
    forming the used portion of the via conductor so as to conduct an alternating current signal from a trace on one layer of the PCB to a trace on another layer of the PCB,
    the alternating current signal characterized by a frequency high enough to demonstrate skin effect, moving the alternating current toward the surface of the via conductor.

3. The method of claim 1 further comprising:
    forming the unused portion of the via conductor with no connection to any further trace,
    the unused portion of the via conductor implementing a resonant stub effecting an insertion loss of the alternating current signal centered on a resonant frequency,
    the metal having a conductivity lower than the conductivity of copper increasing resistive dampening of resonance and reducing the insertion loss.

4. The method of claim 1 wherein the metal having a conductivity lower than the conductivity of copper is iron.

5. The method of claim 1 wherein the metal having a conductivity lower than the conductivity of copper is nickel.

* * * * *